(12) United States Patent
Shiue (10) Patent No.: US 9,918,379 B2
(45) Date of Patent: Mar. 13, 2018

(54) CIRCUIT BOARD

(71) Applicant: Chung Yuan Christian University, Taoyuan (TW)

(72) Inventor: Guang-Hwa Shiue, Taoyuan (TW)

(73) Assignee: CHUNG YUAN CHRISTIAN UNIVERSITY, Taoyuan (TW)

( * ) Notice: Subject to any disclaimer, the term of this patent is extended or adjusted under 35 U.S.C. 154(b) by 106 days.

(21) Appl. No.: 14/993,280

(22) Filed: Jan. 12, 2016

(65) Prior Publication Data

US 2017/0156203 A1  Jun. 1, 2017

(30) Foreign Application Priority Data

Nov. 27, 2015  (TW) ............... 104139696 A (51) Int. Cl.
| | |
|---|---|
| *H01P 5/00* | (2006.01) |
| *H01P 3/08* | (2006.01) |
| *H05K 1/02* | (2006.01) |
| *H05K 1/11* | (2006.01) |
| *H01P 3/02* | (2006.01) |

(52) U.S. Cl.
CPC .......... *H05K 1/0216* (2013.01); *H01P 3/026* (2013.01); *H01P 3/08* (2013.01); *H05K 1/0298* (2013.01); *H05K 1/115* (2013.01)

(58) Field of Classification Search
CPC ....... H05K 2201/09236; H05K 1/0219; H05K 1/0298; H01P 3/08

USPC .......................... 333/1, 5, 34, 238
See application file for complete search history.

(56) References Cited

U.S. PATENT DOCUMENTS

| | | | | | |
|---|---|---|---|---|---|
| 6,040,524 | A * | 3/2000 | Kobayashi | ........... | H05K 1/0219 174/262 |
| 7,609,125 | B2 * | 10/2009 | van Quach | .......... | H05K 1/0219 333/238 |
| 7,898,355 | B2 * | 3/2011 | Lee | ......... | H01P 3/003 333/238 |
| 8,044,746 | B2 * | 10/2011 | Blair | ....... | H01P 3/006 333/247 |
| 8,629,741 | B2 * | 1/2014 | Cho | ...... | H01P 1/2013 333/1 |

* cited by examiner

*Primary Examiner* — Dean Takaoka
(74) *Attorney, Agent, or Firm* — Locke Lord LLP; Tim Tingkang Xia, Esq.

(57) ABSTRACT

A circuit board includes a substrate, two signal lines, two ground lines and two ground vias. The substrate includes a signal layer, a ground layer and an insulation layer. The signal layer is spaced apart from the ground layer. The signal lines are disposed on the signal layer with a first distance between the signal lines. The two signal lines are symmetrical about a reference line. The ground lines are disposed on the signal layer with a second distance between the first signal line and the first ground line. The second ground lines are disposed on the signal layer with one of the ground lines including two line portions having different widths. One of the ground vias is located at a joint between the two line portions. The two ground vias are symmetrical about the reference line.

8 Claims, 11 Drawing Sheets

CIRCUIT BOARD

CROSS-REFERENCE TO RELATED APPLICATIONS

This non-provisional application claims priority under 35 U.S.C. § 119(a) on Patent Application No(s). 104139696 filed in Taiwan R.O.C. on Nov. 27, 2015, the entire contents of which are hereby incorporated by reference.

TECHNICAL FIELD

The present disclosure provides a circuit board, more particular to a circuit board having a plurality of ground vias.

BACKGROUND

With the transmission rate of digitized signals has become faster, the digitized signal is transmitted by the differential signal line for reducing the electromagnetic interference (EMI). A circuit board may include one or more differential signal lines for being applicable to different applications. Generally, there are two ground lines respectively located at opposite two sides of a pair of two differential signal lines for preventing crosstalk noise.

SUMMARY

According to the disclosure, a circuit board includes a substrate, a first signal line, a second signal line, a first ground line, a second ground line, a first ground via and a second ground via. The substrate includes a signal layer, a ground layer and an insulation layer. The signal layer is spaced apart from the ground layer, and the insulation layer is disposed between the signal layer and the ground layer. The first signal line is disposed on the signal layer and has a first width. The second signal line is disposed on the signal layer and has the first width. The second signal line is located at a first side of the first signal line with a first distance between the first signal line and the second signal line. The first signal line and the second signal line are symmetrical about a reference line. The first ground line is disposed on the signal layer. The first ground line is located at a second side of the first signal line with a second distance between the first signal line and the first ground line. The first ground line includes a first line portion and a second line portion. The first line portion has a second width. The second line portion is connected to the first line portion and has a third width greater than the second width. The second ground line is disposed on the signal layer and has the second width. The second ground line is located at a side of the second signal line with the second distance between the second signal line and the second ground line. The first ground via penetrates through the insulation layer of the substrate. The first ground via connects the first ground line to the ground layer, and the first ground via is located at a joint between the first line portion and the second line portion of the first ground line. The second ground via penetrates through the insulation layer of the substrate. The second ground via connects the second ground line to the ground layer. The first ground via and the second ground via are symmetrical about the reference line.

BRIEF DESCRIPTION OF THE DRAWINGS

The present invention will become more understood from the detailed description given hereinbelow and the accompanying drawings which are given by way of illustration only and thus are not limitative of the present invention and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
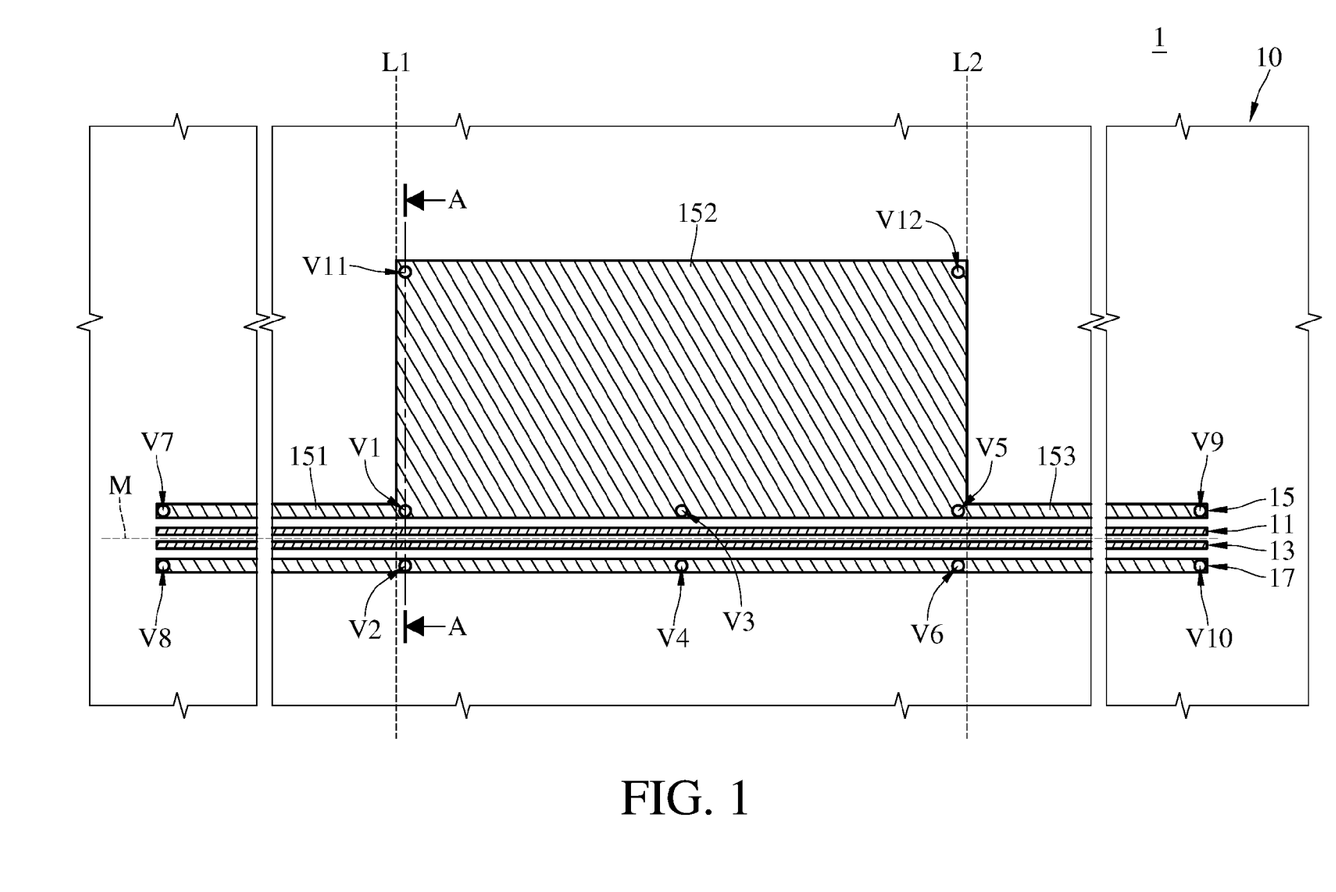
FIG. 1 is a top view of a circuit board according to a first embodiment.
Figure 2:
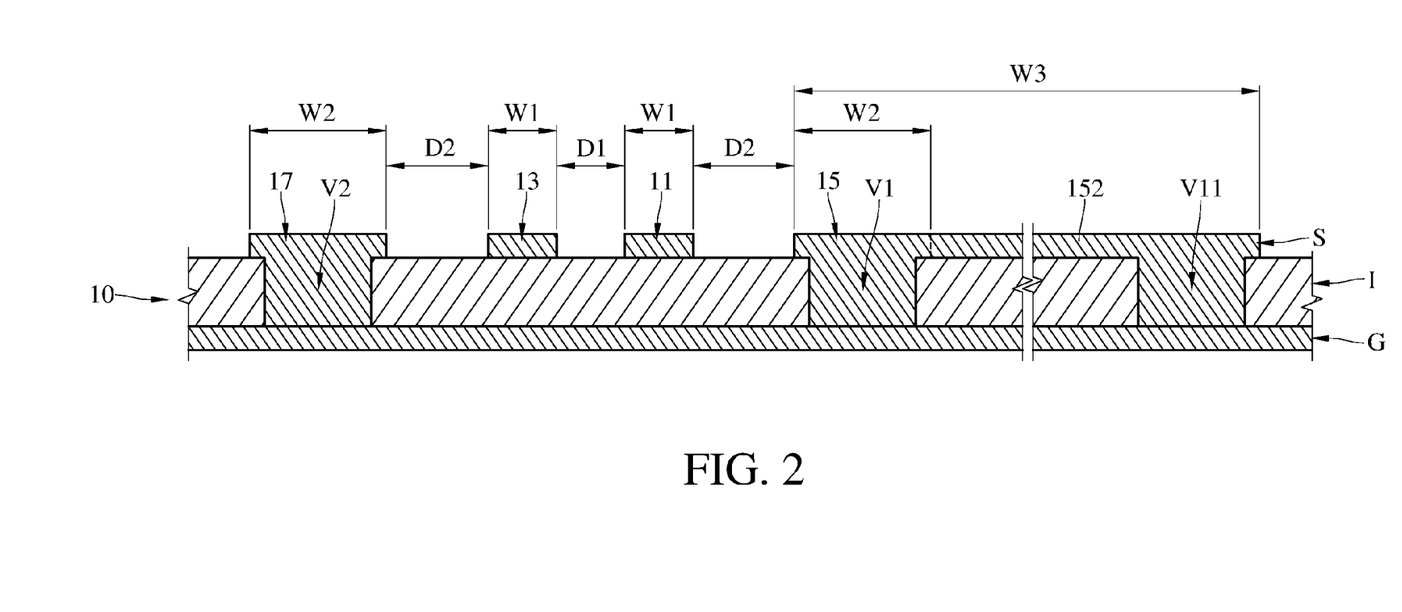
FIG. 2 is a cross-sectional view of the circuit board in FIG. 1 along a line A-A.

Please refer to FIG. 1 and FIG. 2. FIG. 1 is a top view of a circuit board according to a first embodiment. FIG. 2 is a cross-sectional view of the circuit board in FIG. 1 along a line A-A. In this embodiment, the circuit board 1 includes a substrate 10, a signal line 11 (first signal line), a signal line 13 (second signal line), a ground line 15 (first ground line), a ground line 17 (second ground line), a ground via V1 (first ground via) and a ground via V2 (second ground via). The circuit board 1 may be a printed circuit board (PCB). The substrate 10 includes a signal layer S and a ground layer G and an insulation layer I. The signal layer S spaced apart from the ground layer G, and the insulation layer I is disposed between the signal layer S and the ground layer G. The ground later G is connected to ground. In this embodiment, the thickness of the insulation layer I may be 4.0 mils (thousandth of an inch), and a dielectric constant (permittivity) of the insulation layer I may be 4.40, but the disclosure is not limited thereto. There may be a stuff located in the ground via such as metal pillar or metal film so that members in the circuit board 1 can be coupled or electrically connected to each other through one or more the ground vias.

Both of the two signal lines 11 and 13 are disposed on the signal layer S and have a width W1 (first width). The signal line 13 is located at a first side of the signal line 11, and there is a distance D1 (first distance) between the signal line 11 and the signal line 13. In this embodiment, the width W1 may be 4.0 mils, and the distance D1 may be 4.0 mils, but the disclosure is not limited thereto. As shown in FIG. 1, the signal lines 11 and 13 are symmetrical about a reference line M. The reference line M may extend along the signal lines 11 and 13 with both of the signal lines 11 and 13 may parallel to the reference line M, and a distance between the signal line 11 and the reference line M may be equal to that between the signal line 13 and the reference line M.

The ground line 15 is disposed on the signal layer S and is located at a second side of the signal line 11. There is a distance D2 (second distance) between the signal line 11 and the ground line 15. The ground line 15 includes a line portion 151 (first line portion) and a line portion 152 (second line portion) that are connected to each other. The line portion 151 of the ground line 15 has a width W2 (second width), and the line portion 152 has a width W3 (third width). The width W3 is greater than the width W2. The ground line 17 is disposed on the signal layer S and is located at a side of the signal line 13 away from the signal line 11, and there is the distance D2 between the signal line 13 and the ground line 17. The ground line 17 has the width W2. In this embodiment, the width W2 may be 8.0 mils, the width W3 may be 9 millimeters, and the distance D2 may be 6.0 mils, but the disclosure is not limited thereto.

In this embodiment, the ratio of the width W1 to the width W2 may be 1:2, and the ratio of the distance D1 to the distance D2 may be 1:1.5. Each of the thicknesses of the signal line 11, the signal line 13, the ground line 15 and the ground line 17 may be 1.4 mils. The sizes of the aforementioned members are only exemplary, and the disclosure is not limited thereto.

The ground via V1 penetrates through the insulation layer I and connects the ground line 15 to the ground layer G. In detail, the ground via V1 extends through two sides of the insulation layer I, and different two ends of the ground via V1 are respectively connected to the ground line 15 and the ground layer G. The ground via V1 is located at a joint between the line portion 151 and the line portion 152 of the ground line 15. In detail, as shown in FIG. 1, there is a reference line L1 passing across the position where the line portion 151 is connected to the line portion 152, and the section of the ground line 15 around the position where the reference line L1 passes is defined as the joint between the line portion 151 and the line portion 152.

The ground via V2 penetrates through the insulation layer I and connects the ground line 17 to the ground layer G. In detail, the ground via V2 extends through the two sides of the insulation layer I, and different two ends of the ground via V2 are respectively connected to the ground line 15 and the ground layer G. Both of the lengths of the ground vias V1 and V2 are substantially equal to the thickness of the insulation layer I. The ground via V1 and the ground via V2 are symmetrical about the reference line M. In this embodiment, both of the diameters of the ground vias V1 and V2 are substantially equal to the width W2, but the disclosure is not limited thereto. In other embodiments, the diameters of the ground vias V1 and V2 may be less than the width W2.

Moreover, in this embodiment, both of the ground vias V1 and V2 are located at the right side of the reference line L1 in FIG. 1. In other words, the ground via V1 penetrates through the insulation layer I and is coupled to the line portion 152 and the ground layer G, but the disclosure is not limited thereto. In some other embodiments, both of the ground vias V1 and V2 may be located at the left side of the reference line L1. In other words, the ground via V1 penetrates through the insulation layer I and may be coupled to the line portion 151 and the ground layer G. In some other embodiments, both of the ground vias V1 and V2 may be located on the reference line L1. In other words, the ground via V1 penetrates through the insulation layer I and may be coupled to the line portions 151, 152 and the ground layer G.

In this embodiment, the circuit board 1 may further include a ground via V3 (third ground via) and a ground via V4 (fourth ground via). The ground via V3 penetrates through the insulation layer I and connects the line portion 152 of the ground line 15 to the ground layer G. In detail, the ground via V3 extends through the two sides of the insulation layer I, and different two ends of the ground via V3 are respectively connected to the line portion 152 and the ground layer G. The ground via V4 penetrates through the insulation layer I and connects the ground line 17 to the ground layer G. In detail, the ground via V4 extends through the two sides of the insulation layer I, and different two ends of the ground via V4 are respectively connected to the ground line 17 and the ground layer G. Both of the lengths of the ground vias V3 and V4 are substantially equal to the thickness of the insulation layer I. The ground via V3 and the ground via V4 are symmetrical about the reference line M. In this embodiment, the ground via V3 is located at an edge of the line portion 152 close to the signal line 11 so that a distance between the ground via V3 and the signal line 11 is substantially equal to a distance between the ground via V4 and the signal line 13. Furthermore, in this embodiment, both of the diameters of the two ground vias V3 and V4 are substantially equal to the width W2, but the disclosure is not limited thereto. In other embodiments, the diameters of the ground vias V3 and V4 may be less than the width W2.

In this embodiment, the ground line 15 may further include a line portion 153 (third line portion). The line portion 151 and the line portion 153 are respectively connected to different two ends of the line portion 152, and the line portion 152 is located between the line portion 151 and the line portion 153. The line portion 153 has the width W2.

In this embodiment, the circuit board 1 may further include a ground via V5 (fifth ground via) and a ground via V6 (sixth ground via). The ground via V5 penetrates through the insulation layer I and connects the ground line 15 to the ground layer G. In detail, the ground via V5 extends through the two sides of the insulation layer I, and different two ends of the ground via V5 are respectively connected to the ground line 15 and the ground layer G. The ground via V5 is located a joint between the line portion 152 and the line portion 153. In detail, there is a reference line L2 passing across the position where the line portion 152 is connected to the line portion 153, and the section of the ground line 15 around the position where the reference line L2 passes is defined as the joint between the line portion 152 and the line portion 153.

The ground via V6 penetrates through the insulation layer I and connects the ground line 17 to the ground layer G. In detail, the ground via V6 extends through the two sides of the insulation layer I, and different two ends of the ground via V6 are respectively connected to the ground line 17 and the ground layer G. The ground via V5 and the ground via V6 are symmetrical about the reference line M. In this embodiment, both of the diameters of the ground vias V5 and V6 are substantially equal to the width W2, but the disclosure is not limited thereto. In other embodiments, the diameters of the ground vias V5 and V6 may be less than the width W2.

Moreover, in this embodiment, both of the ground vias V5 and V6 are located at the left side of the reference line L2 in FIG. 1. In other words, the ground via V5 penetrates through the insulation layer I and is coupled to the line portion 152 and the ground layer G, but the disclosure is not limited thereto. In some other embodiments, both of the ground vias V5 and V6 may be located at the right side of the reference line L2. In other words, the ground via V1 penetrates through the insulation layer I and may be coupled to the line portion 153 and the ground layer G. In some other embodiments, both of the ground vias V5 and V6 may be located on the reference line L1. In other words, the ground via V5 penetrates through the insulation layer I and may be coupled to the line portions 152, 153 and the ground layer G.

In addition, the circuit board 1 may further include a ground via V7, a ground via V8, a ground via V9, a ground via V10, a ground via V11 and a ground via V12. As shown in FIG. 1, the ground via V7 connects the line portion 151 of the ground line 15 to the ground layer G and may be located at the left side of the ground via V1. The ground via V8 connects the ground line 17 to the ground layer G and may be located at the left side of the ground via V2. The ground via V9 connects the line portion 153 of the ground line 15 to the ground layer G and may be located at the right side of the ground via V5. The ground via V10 connects the ground line 17 to the ground layer G and may be located at the right side of the ground via V6. The ground via V11 connects the line portion 152 of the ground line 15 to the ground layer G and may be located at an edge of the line portion 152 away from the signal line 11. The ground via V12 connects the line portion 152 of the ground line 15 to the ground layer G and may be located at the edge of the line portion 152 away from the signal line 11. The arrangement of the ground vias V8~V12 is optional in this embodiment.

According to the disclosure, the arrangement of the ground vias V1 and V2 is favorable for reducing the current path mismatch between the ground line 15 and the ground line 17 so as to reduce the common mode noise. In detail, in the first embodiment, there is a first current path between the ground via V7 and the ground via V3, and there is a second current path between the ground via V8 and the ground via V4. In a conventional circuit board without including the ground vias V1 and V2, the difference between the widths of the line portion 151 and the line portion 152 results in the current path mismatch between the first current path and the second current path so that the current tends to flow through the section of the line portion 152 away from the signal line 11, thereby causing common mode noise. When the ground vias V1 and V2 are respectively disposed on the ground lines 15 and 17, there is a first path section of the first current path between the ground vias V1 and V7, and there is a second path section of the second current path between the ground vias V2 and V8. Furthermore, there is a third path section of the first current path between the ground vias V1 and V3, and there is a fourth path section of the second current path between the ground vias V2 and V4. The first path section of the first current path matches the second path section of the second current path so as to reduce the common mode noise. the arrangement of the ground vias V1 and V2 is favorable for the current through the ground line 15 tending to flow along the edge of the line portion 152 close to the signal line 11 so as to reduce the current path mismatch between the third path section of the first current path and the fourth path section of the second current path, thereby effectively reducing the common mode noise.

In the first embodiment, the first current path is between the ground via V7 and the ground via V3, and the second current path between the ground via V8 and the ground via V4, but the disclosure is not limited thereto. In other embodiments without including the ground vias V7~V10, the first current path is located at a part of the ground line 15 or all of the ground line 15, and the second current path is located at a part of the ground line 17 or all of the ground line 17.

Figure 3:
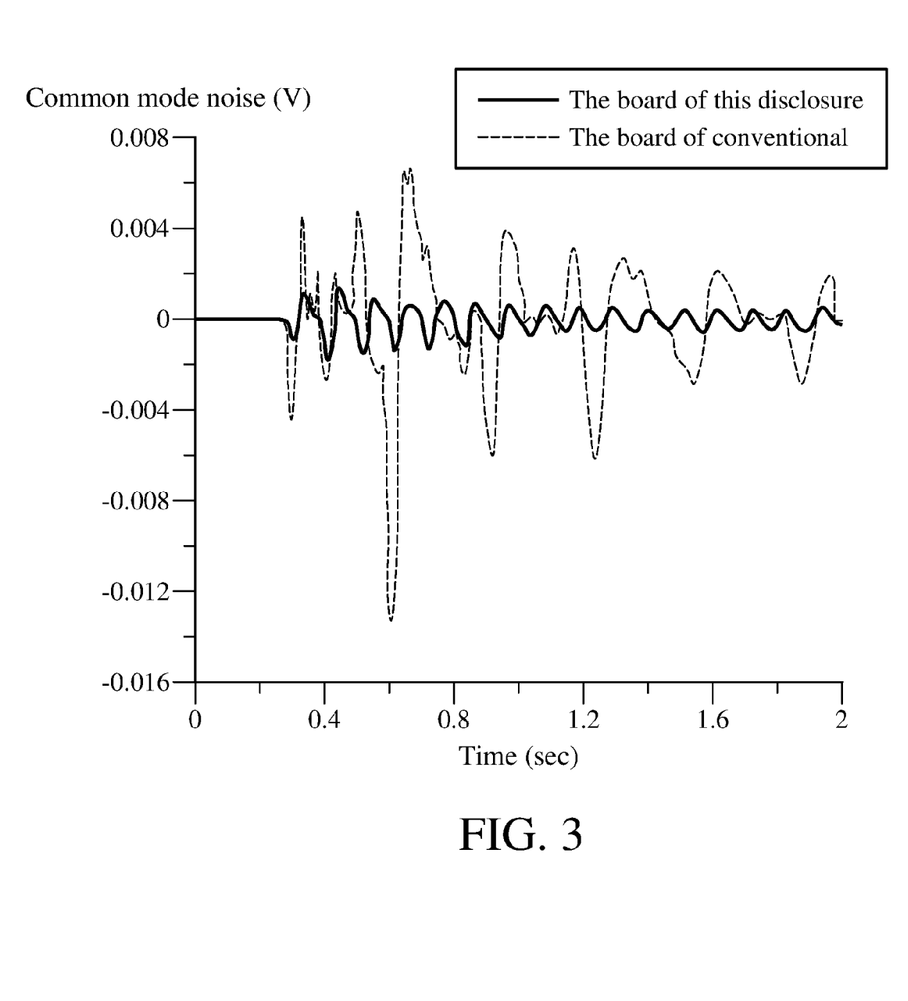
FIG. 3 is a diagram illustrating a relation between the common mode noise and the measuring time according to the first embodiment and the prior art.
Figure 4:
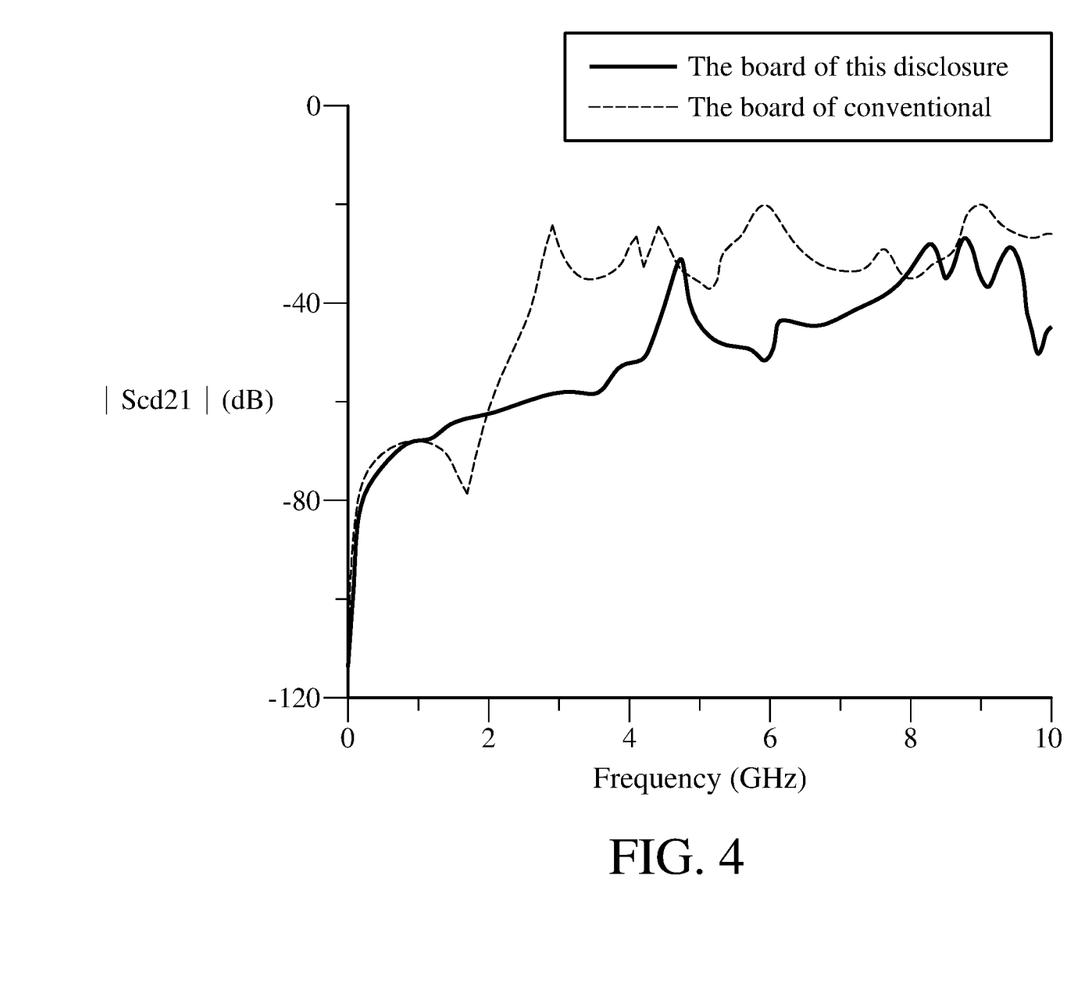
FIG. 4 is a diagram illustrating a relation between the S-parameter Scd21 and the signal frequency according to the first embodiment and the prior art.
Figure 5:
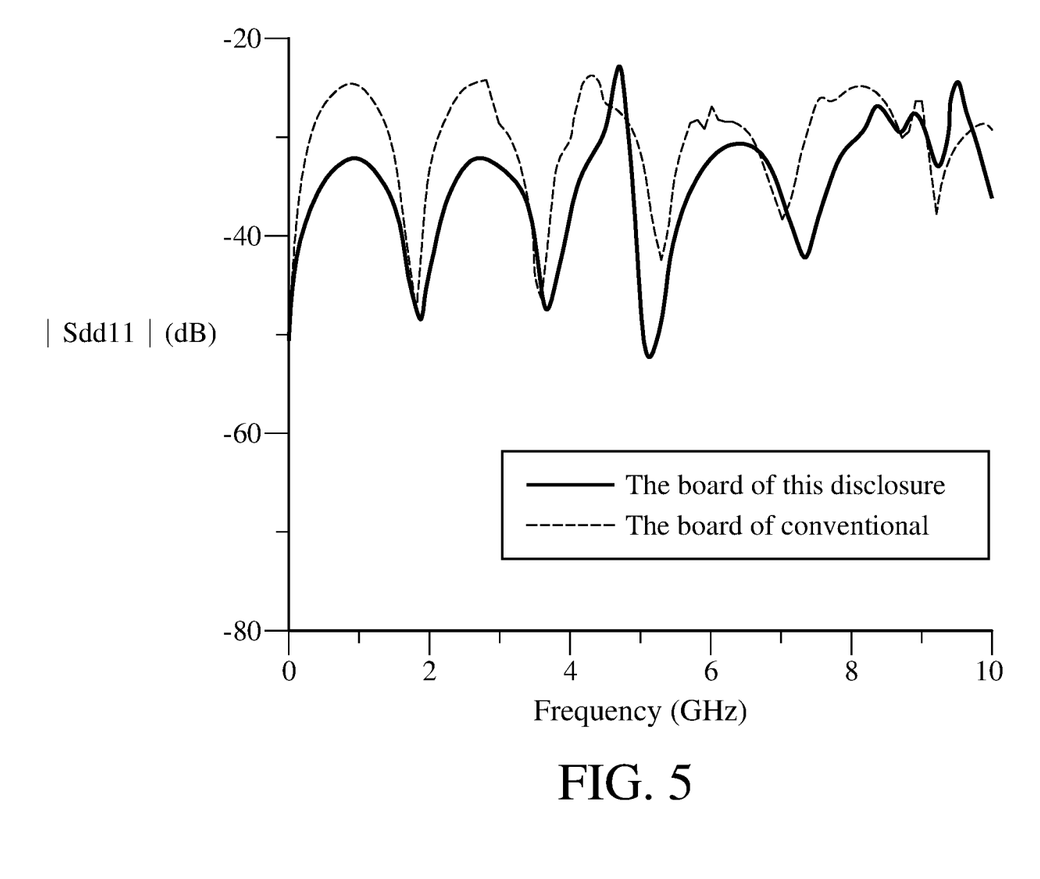
FIG. 5 is a diagram illustrating a relation between the S-parameter Sdd11 and the signal frequency according to the first embodiment and the prior art.
Figure 6:
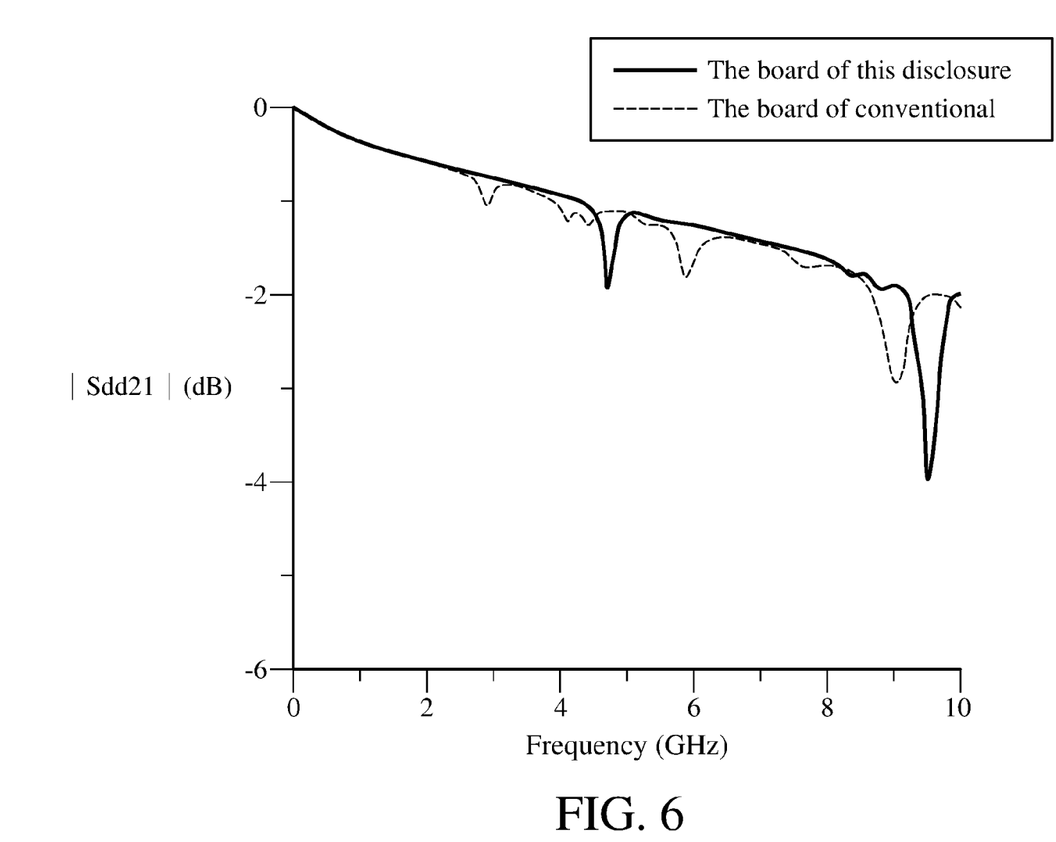
FIG. 6 is a diagram illustrating a relation between the S-parameter Sdd21 and the signal frequency according to the first embodiment and the prior art.

Please refer to FIG. 3 to FIG. 6. FIG. 3 is a diagram illustrating a relation between the common mode noise and the measuring time according to the first embodiment and the prior art. FIG. 4 is a diagram illustrating a relation between the S-parameter Scd21 and the signal frequency according to the first embodiment and the prior art. FIG. 5 is a diagram illustrating a relation between the S-parameter Sdd11 and the signal frequency according to the first embodiment and the prior art. FIG. 6 is a diagram illustrating a relation between the S-parameter Sdd21 and the signal frequency according to the first embodiment and the prior art. The S-parameters (Scattering parameters) Scd21, Sdd11 and Sdd21 are for describing the electrical behaviors of the circuit such as input common return loss, input differential return loss and input differential insertion loss. The definitions and the representations of the common mode noise, the S-parameters Scd21, Sdd11 and Sdd21 are obvious to one having ordinary skill in the art so that the related illustration is omitted. As shown in FIG. 3 to FIG. 6, the circuit board 1 has less common mode noise than the conventional circuit board. Furthermore, the circuit board 1 has smaller Scd21 and Sdd11 than the conventional circuit board for most of the frequency band lower than 10 GHz, and the circuit board 1 has similar Sdd21 to the conventional circuit board for the frequency band lower than 10 GHz.

Figure 7:
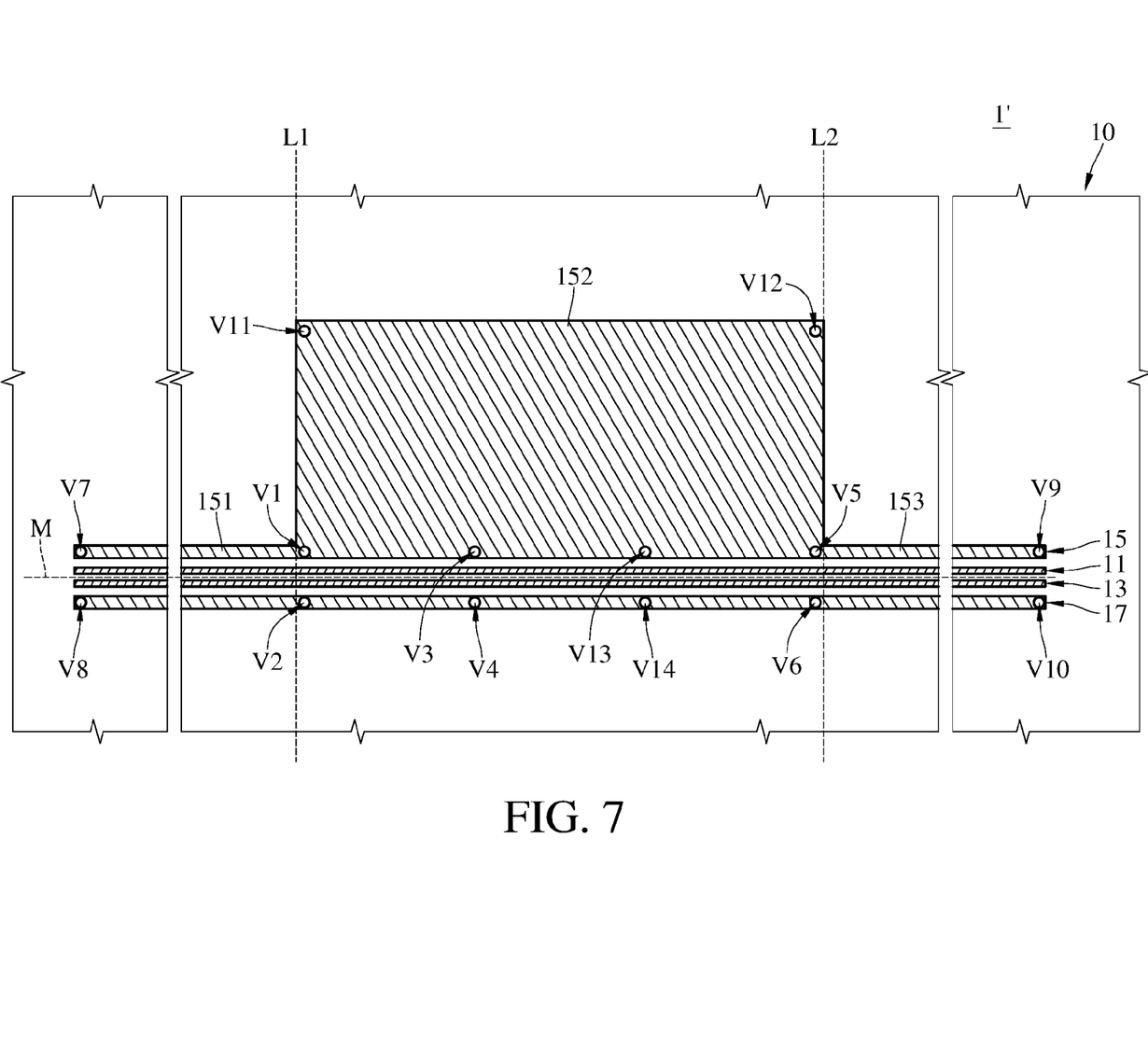
FIG. 7 is a top view of a circuit board according to a second embodiment.

Please refer to FIG. 7. FIG. 7 is a top view of a circuit board according to a second embodiment. Since the second embodiment is similar to the first embodiment, only the differences will be illustrated hereafter. In this embodiment, the circuit board 1' may further include a ground via V13 and a ground via V14. The ground via V13 penetrates through the insulation layer I and connects the ground line 15 and the ground layer G. The ground via V14 penetrates through the insulation layer I and connects the ground line 17 to the ground layer G. Both of the lengths of the ground vias V13 and V14 are substantially equal to the thickness of the insulation layer I. The ground via 13 and the ground via V14 are symmetrical about the reference line M. In this embodiment, both of the diameters of the two ground vias V13 and V14 are substantially equal to the width W2, but the disclosure is not limited thereto. In other embodiments, the diameters of the ground vias V13 and V14 may be less than the width W2. The ground vias V3 and V13 together divide the distance between the ground vias V1 and V5 into three equal sections, and the ground vias V4 and V14 together divide the distance between the ground vias V2 and V6 into three equal sections. The arrangement of the ground vias V13 and V14 is favorable for the current through the ground line 15 further tending to flow along the edge of the line portion 152 close to the signal line 11 so as to further reduce the common mode noise.

Figure 8:
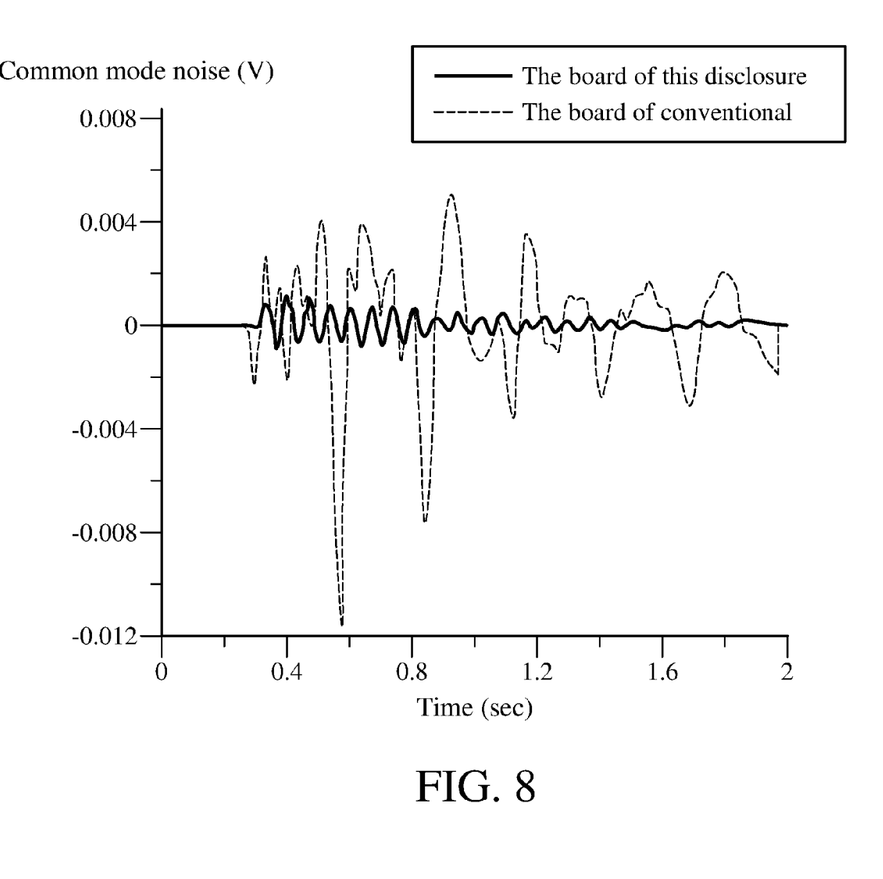
FIG. 8 is a relation between the common mode noise and the measuring time according to the second embodiment and the prior art.
Figure 9:
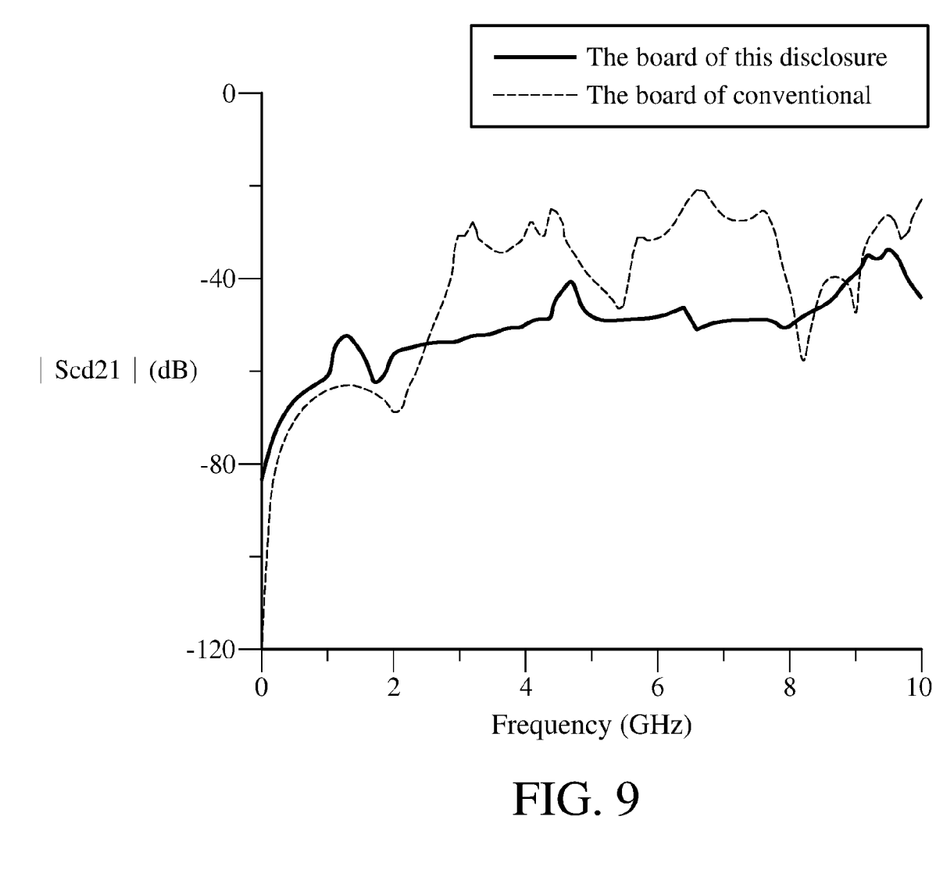
FIG. 9 is a diagram illustrating a relation between the S-parameter Scd21 and the signal frequency according to the second embodiment and the prior art.
Figure 10:
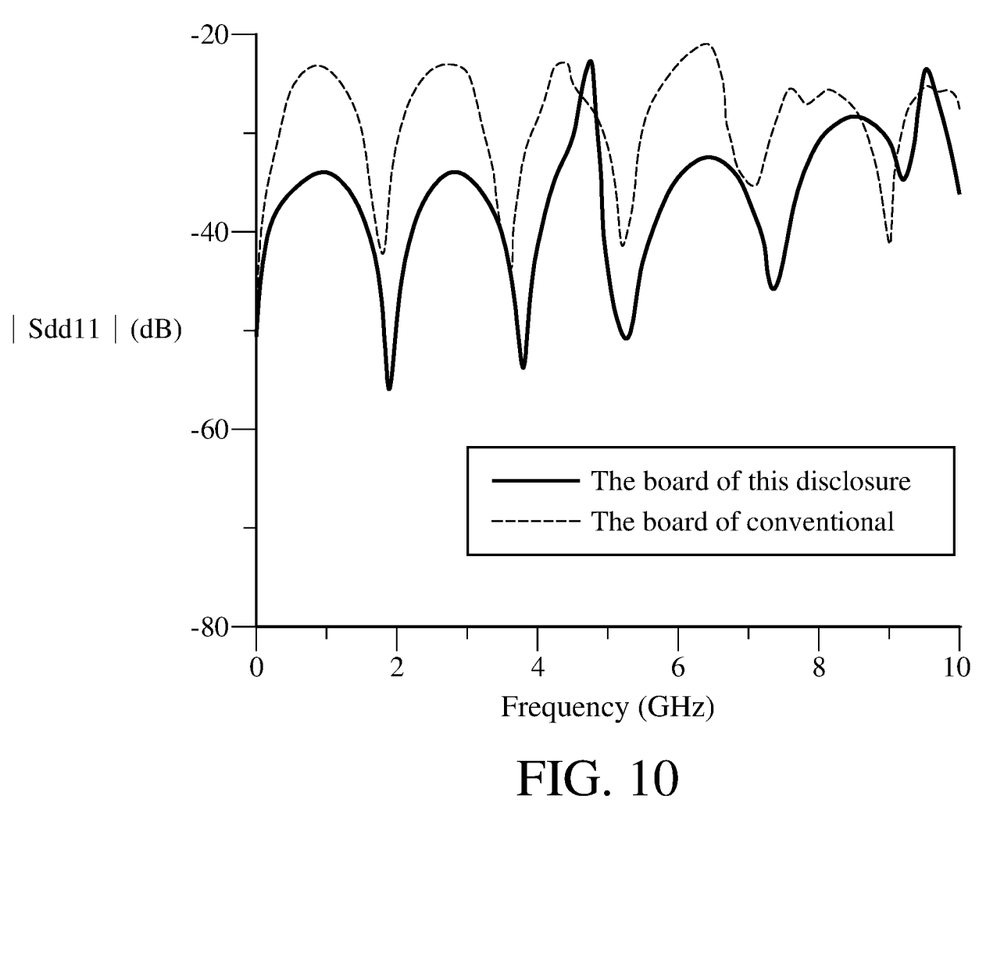
FIG. 10 is a diagram illustrating a relation between the S-parameter Sdd11 and the signal frequency according to the second embodiment and the prior art.
Figure 11:
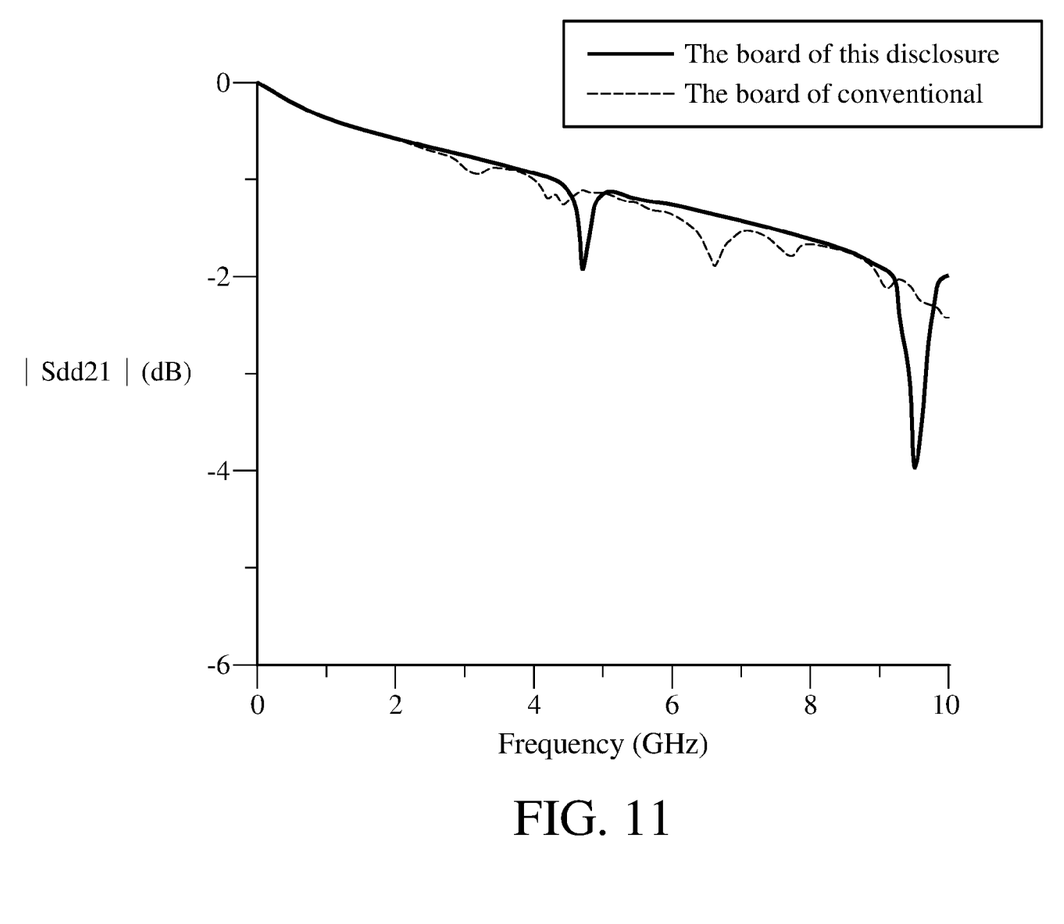
FIG. 11 is a diagram illustrating a relation between the S-parameter Sdd21 and the signal frequency according to the second embodiment and the prior art.

Please refer to FIG. 8 to FIG. 11. FIG. 8 is a relation between the common mode noise and the measuring time according to the second embodiment and the prior art. FIG. 9 is a diagram illustrating a relation between the S-parameter Scd21 and the signal frequency according to the second embodiment and the prior art. FIG. 10 is a diagram illustrating a relation between the S-parameter Sdd11 and the signal frequency according to the second embodiment and the prior art. FIG. 11 is a diagram illustrating a relation between the S-parameter Sdd21 and the signal frequency according to the second embodiment and the prior art. As the aforementioned illustration in the first embodiment, the circuit board 1' has less common mode noise than the conventional circuit board. Furthermore, the circuit board 1' has smaller Scd21 and Sdd11 than the conventional circuit board for most of the frequency band lower than 10 GHz, and the circuit board 1' has similar Sdd21 to the conventional circuit board for the frequency band lower than 10 GHz.

According to the disclosure, the circuit board includes the first ground via and the second ground via. The first ground via is located at the joint between the first line portion and the second line portion of the first ground line, and the second ground via is connected to the second ground line. Furthermore, the first ground via and the second ground via are symmetrical about the reference line which the first signal line and the second signal line are symmetrical about. Therefore, it is favorable for reducing the common mode noise resulting from the ground lines. The first ground via and the second ground via are respectively for connecting the first ground line and the second ground line to the ground layer of the substrate.

The foregoing description, for the purpose of explanation, has been described with reference to specific embodiments; however. The embodiments were chosen and described in order to best explain the principles of the disclosure and its practical applications, to thereby enable others skilled in the art to best utilize the disclosure and various embodiments with various modifications as are suited to the particular use contemplated. The embodiments depicted above and the appended drawings are exemplary and are not intended to be exhaustive or to limit the scope of the disclosure to the precise forms disclosed. Modifications and variations are possible in view of the above teachings.

What is claimed is:

1. A circuit board, comprising:
   a substrate comprising a signal layer, a ground layer and an insulation layer, the signal layer spaced apart from the ground layer, and the insulation layer disposed between the signal layer and the ground layer;
   a first signal line disposed on the signal layer and having a first width;
   a second signal line disposed on the signal layer and having the first width, the second signal line being next to and having a first distance with the first signal line, and the first signal line and the second signal line being symmetrical about a reference line;
   a first ground line that is disposed on the signal layer, the first ground line having a second distance with the first signal line and comprising a first line portion and a second line portion, the first line portion having a second width, the second line portion connected to the first line portion and having a third width greater than the second width;
   a second ground line disposed on the signal layer, a width of the second ground line substantially being equal to the second width, the second ground line being next to and having the second distance with the second signal line, and the first and second signal lines located between the first and second ground lines;
   a first ground via penetrating through the insulation layer of the substrate, the first ground via connecting the first ground line to the ground layer, and the first ground via located at a joint between the first line portion and the second line portion of the first ground line; and
   a second ground via penetrating through the insulation layer of the substrate, the second ground via connecting the second ground line to the ground layer, and the first ground via and the second ground via being symmetrical about the reference line.

2. The circuit board according to claim 1, further comprising:
   a third ground via penetrating through the insulation layer of the substrate, and the third ground via connecting the second line portion of the first ground line to the ground layer; and
   a fourth ground via penetrating through the insulation layer of the substrate, the fourth ground via connecting the second ground line to the ground layer, and the third ground via and the fourth ground via being symmetrical about the reference line.

3. The circuit board according to claim 2, wherein the first ground line further comprises a third line portion, the first line portion and the third line portion are respectively connected to two ends of the second line portion, and the third line portion has the second width.

4. The circuit board according to claim 3, further comprising:
   a fifth ground via penetrating through the insulation layer of the substrate, the fifth ground via connecting the first ground line to the ground layer, and the fifth ground via located at a joint between the second line portion and the third line portion of the first ground line; and
   a sixth ground via penetrating through the insulation layer of the substrate, the sixth ground via connecting the second ground line to the ground layer, and the fifth ground via and the sixth ground via being symmetrical about the reference line.

5. The circuit board according to claim 4, wherein a distance between the first ground via and the third ground via is equal to a distance between the third via and the fifth via.

6. The circuit board according to claim 2, wherein the third ground via is located at an edge of the second line portion close to the first signal line.

7. The circuit board according to claim 1, further comprising:
   a third ground via penetrating through the insulation layer of the substrate, and the third ground via connecting the first line portion of the first ground line to the ground layer; and
   a fourth ground via penetrating through the insulation layer of the substrate, the fourth ground via connecting the second ground line to the ground layer, and the third ground via and the fourth ground via being symmetrical about the reference line.

8. The circuit board according to claim 1, wherein the second width is greater than the first width.

* * * * *